United States Patent
Kung

[11] Patent Number: 6,037,825
[45] Date of Patent: Mar. 14, 2000

[54] TREE MIXER OPERABLE IN CLASS A, B OR AB

[75] Inventor: William Kung, Nepean, Canada

[73] Assignee: Nortel Networks Corporation, Montreal, Canada

[21] Appl. No.: 08/963,822

[22] Filed: Nov. 4, 1997

[51] Int. Cl.[7] .................................................. G06F 7/44
[52] U.S. Cl. .......................... 327/359; 327/356; 327/563; 455/333
[58] Field of Search ..................................... 327/116, 119, 327/120, 356, 357, 359, 563; 455/326, 333; 330/259, 260, 261, 282, 283, 284, 291, 293

[56] References Cited

U.S. PATENT DOCUMENTS

| | | | |
|---|---|---|---|
| 4,454,433 | 6/1984 | Welland | 327/352 |
| 4,667,342 | 5/1987 | Lindenmeier et al. | 455/150 |
| 5,182,477 | 1/1993 | Yamasaki et al. | 327/356 |
| 5,410,744 | 4/1995 | Rinderle et al. | 455/333 |
| 5,532,637 | 7/1996 | Khoury et al. | 327/359 |
| 5,627,486 | 5/1997 | Gross | 327/356 |

OTHER PUBLICATIONS

B. Gilbert, "A Precise Four–Quadrant Multiplier With Sub-nanosecond Response," IEEE Journal of Solid–State Circuits, vol. SC–3, pp. 365–373, Dec. 1968.

J. Durec Et Al., "Motorola's Mosaic V Silicon Bipolar RF Building Blocks Fill Gaps in High Performance Low Power Wireless Chip Sets," Proceedings of the 4th Wireless Symnposium, Santa Clara, U.S.A., pp. 218–223, 1996.

B. Gilbert (Analog Devices). Design Considerations for BJT Active Mixers. (Course Notes). 1995.

*Primary Examiner*—Kenneth B. Wells

[57] ABSTRACT

In a tree mixer having an input differential pair of transistors as a gain stage and two differential pairs of transistors (transistor quad) as a mixing stage, a further transistor quad in the mixing stage is provided. The further transistor quad is complementary with respect to the first transistor quad. A DC offset is applied between respective mixing inputs of the two transistor quads and the local oscillator input signal is applied to both inputs. The two transistor quads are interconnected through summing circuits such as current mirrors. By appropriately setting the DC offset the mixer can be operated in class A, B or AB as desired.

16 Claims, 8 Drawing Sheets

TREE MIXER OPERABLE IN CLASS A, B OR AB

FIELD OF THE INVENTION

This invention relates to mixers, and is particularly concerned with a tree mixer, which can provide linear and low-noise operation. Such mixers are specially useful in radio communications systems.

BACKGROUND OF THE INVENTION

Tree mixers, also known as analog multipliers or Gilbert multipliers, have been widely used in integrated circuits for communications systems for many years. As is known for example from B. Gilbert, "A Precise Four-Quadrant Multiplier with Subnanosecond Response", IEEE Journal of Solid-State Circuits, Vol. SC-3. Pages 365–373, December 1968, such a mixer or multiplier typically comprises a first or lower differential pair of common emitter transistors to the bases of which a first differential analog input signal is supplied, and two second or upper differential pairs of transistors whose bases are supplied with a second differential analog input signal and whose collector-emitter paths conduct the currents of the lower pair of transistors to produce in their collector circuits an analog output signal which represents the product of the input signals. A single current source in the emitter circuit of the lower pair of transistors provides bias current to all six transistors. For use as a mixer in a radio communications receiver or transmitter, for example an input signal is applied to the lower pair of transistors and a local oscillator signal is applied to the two upper pairs, or upper quad, of transistors.

Degeneration resistors connected to the emitters of the lower differential pair of transistors serve to linearize the input stage to accommodate larger input signals without distorting.

Such a circuit provides advantages of good rejection of the input signals at the output, good power supply rejection, and the possibility of conversion gain.

Attempts to enhance the performance of tree mixers have been proposed. For example, two class AB biasing schemes have been proposed by J. Durec et al in "Motorola's Mosaic V Silicon Bipolar RF Building Blocks Fill Gaps in High Performance Low Power Wireless Chip Sets", Proceedings of the 4th Wireless Symposium, Santa Clara, U.S.A., pages 218–223, 1996 and by B. Gilbert in "Design Considerations for BJT Active Mixers. (course notes)" 1995. This technique enables the reduction in the DC bias in the mixer, thereby reducing shot noise in the mixing quad transistors, without degrading linearity. However, the bias schemes employed may negatively impact overall noise performance, and distortion characteristics may vary significantly over a wide range of signal inputs. In addition, the class AB scheme in these mixers precludes the application of a differential input signal to the mixer.

A further example of a tree mixer which is an improvement over the basic tree mixer is described in U.S. Pat. No. 5,532,637 which issued on Jul. 2, 1996 to Khoury et al. This scheme also improves noise performance by reducing the DC current flowing in the upper quad thereby reducing the shot noise in the upper quad transistors. While this circuit maintains good linearity for small signal inputs, it ultimately reduces the maximum undistorted signal that can be obtained at the output unless complicated control circuitry is employed.

An object of the invention is to provide a tree mixer which obviates or mitigates one or more of the above described disadvantages.

SUMMARY OF THE INVENTION

The invention disclosed herein involves the use of complementary devices to realize a class AB mixing scheme, based on the conventional tree mixer topology. Ideally, the complementary devices are matched in electrical performance. The theory of operation of the disclosed class AB mixer is best understood if one considers the tree mixer to be composed of two portions: a linear transconductance gain stage defined by the lower pair, and a transimpedance mixing stage defined by the mixing quad and loads. DC bias is established in the complementary mixing quads and sets the class of mixer operation (A, B, AB), independent of the DC bias in the lower pair; only signal energy is transferred to the mixing quads from the lower pair. For large signal input, only two of the four transimpedance pairs in the mixing quads will conduct at any one time, alternating with the other two transimpedance pairs over the "positive" and "negative" half cycles of the input. The outputs from the mixing quads are summed in a translinear fashion through current mirrors for subsequent delivery to the load.

Broadly, the invention may be summarized as a tree mixer comprising a mixing stage formed by a first differential pair of transistors and a second differential pair of transistors which are complementary with respect to the first differential pair; further comprising a first input for supplying a first input signal to both differential pairs, a second input for supplying a second input signal to the first differential pair and a third input for supplying the second input signal to the second differential pair with a DC offset with respect to the second input, the magnitude of the DC offset determining whether the mixer operates in class A, class B or class AB.

According to another aspect, the invention provides a tree mixer comprising a mixing stage formed by a first transistor quad consisting of two differential pairs of transistors and a second transistor quad consisting of a further two differential pairs of transistors, the second transistor quad being complementary with respect to the first transistor quad; further comprising a first input for supplying a first differential input signal to both transistor quads, a second input for supplying a second differential input signal to the first transistor quad and a third input for supplying the second differential signal to the second transistor quad with a DC offset with respect to the second input, the magnitude of the DC offset determining whether the mixer operates in Class A, class B or class AB.

The invention may result in one or more of the following advantages:

1) Lower static power is dissipated in the mixing quads, resulting in improved noise performance compared to conventional tree mixers.
2) Higher mixer linearity may be achieved due to translinear operation, compared to conventional tree mixers.
3) The disclosed mixer can be fully realized on a single chip using commercially-available integrated circuit process technologies.
4) Bias in the mixer can be adjusted to class A/class AB/class B through a suitable bias network.

BRIEF DESCRIPTION OF THE DRAWINGS

Preferred embodiments of this invention will now be described with reference to the attached drawings in which.

DETAILED DESCRIPTION OF THE PREFERRED EMBODIMENTS

Figure 1:
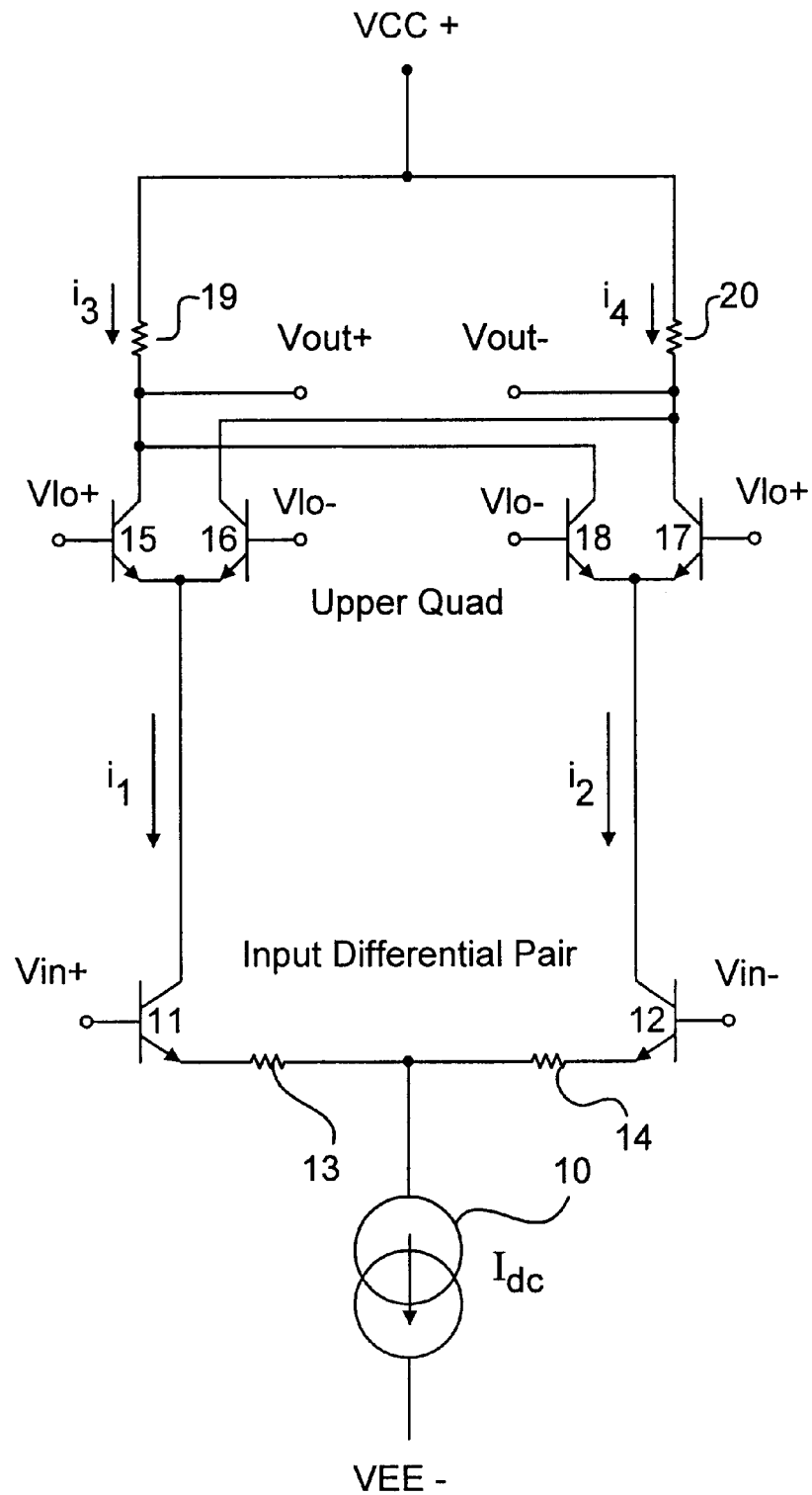
FIG. 1 is a schematic diagraph illustrating a conventional tree mixer.

Referring to FIG. 1, a known tree mixer includes a differential pair of transistors 11 and 12 whose emitters are connected to a constant current source 10 via respective emitter resistors 13 and 14. The constant current source 10 is connected to a negative power supply VEE− and may be constituted simply by a resistor having a suitable value for deriving a desired current or it may be constituted by a specific semiconductor circuit. A first differential analog input signal is supplied to the bases of the transistors 11 and 12 via input terminals Vin+ and Vin− respectively. Two differential pairs of transistors 15, 16 and 17, 18 are connected in the collector circuits of the transistors 11 and 12 respectively. A second differential analog input signal is supplied to the bases of the transistors 15 and 16 via input terminals VLO+ and VLO− respectively. The transistors 15 and 16 have their emitters connected together and to the collector of the transistor 11, and have their collectors connected to differential output terminals Vout+ and Vout− respectively and via respective resistors 19 and 20 to a positive supply voltage VCC+. The second differential analog input signal is also supplied via the input terminals VLO+ and VLO− to the bases of the transistors 17 and 18 respectively, whose emitters are connected together and to the collector of the transistor 12, and whose collectors are cross-connected to the differential output terminals Vout− and Vout+ respectively.

In operation of the tree mixer of FIG. 1, the current I passed by the current source 10 is divided between the transistors 11 and 12 according to the first input signal, the degeneration resistors 13 and 14 increasing a maximum useful input voltage for the mixer and setting an effective transconductance for this input stage of about 1/(2 Re) where Re is the resistance of each of the resistors 13 and 14. Transistors 15 to 18 multiply the currents of the transistors 11 and 12 alternately by +1 and −1 at the frequency of the second signal supplied differentially to the inputs VLO+ and VLO−. In a radio communications mixer, the second signal is typically a local oscillator (LO) signal. The collector currents of the transistors 15 to 18 are converted to a differential output voltage by the collector resistors 19 and 20, with a single sideband conversion gain of $(2/\pi)(Rc/Re)$ where Rc is the resistance of each of the resistors 19 and 20.

Figure 2:
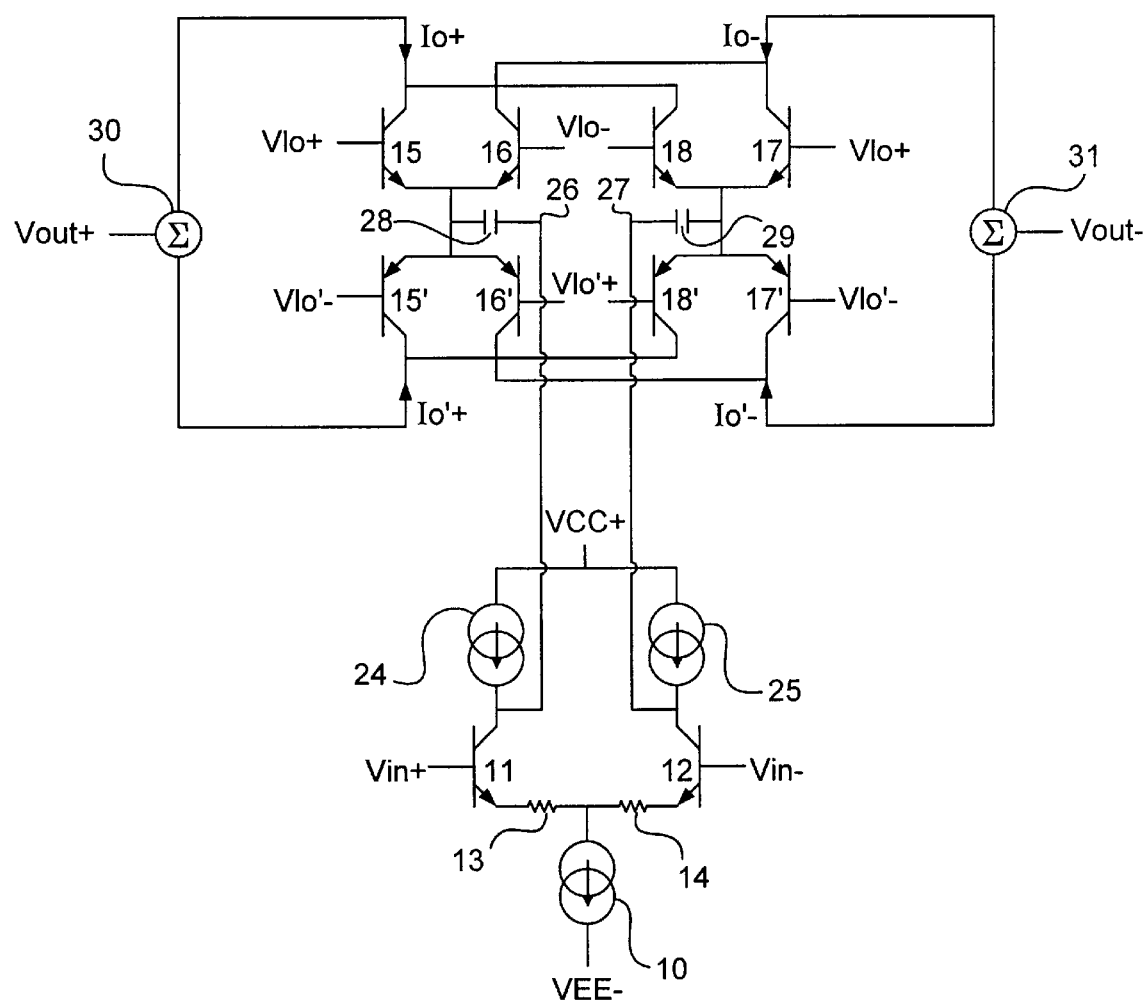
FIG. 2 is a schematic diagram illustrating a tree mixer constructed according to the invention.

Referring now to FIG. 2, as with the conventional tree mixer of FIG. 1, a differential pair of transistors 11 and 12 having emitters connected to a constant current source 10 via respective emitter resistors 13 and 14 forms the first or gain stage of the novel mixer. In addition, constant current sources 24 and 25 are connected to the collectors of transistors 11 and 12, each providing half of the current flowing through constant current source 10. As with the conventional tree mixer the constant current source 10 is connected to a negative power supply VEE−. Also, as with the conventional mixer of FIG. 1, a first differential analog input signal is supplied to the bases of the transistors 11 and 12 via input terminals Vin+ and Vin−.

Instead of the collectors of transistors 11 and 12 being connected just to a single upper transistor quad as in FIG. 1, FIG. 2 shows that the collectors of transistors 11 and 12 are connected through terminals 26 and 27 and a.c. coupling capacitors 28 and 29 to two upper complementary transistor quads. Specifically one of the upper transistor quads consists of npn transistors 15, 16, 17 and 18 connected in identical fashion as the transistors 15, 16, 17 and 18 of FIG. 1. The other transistor quad consists of pnp transistors 15', 16', 17' and 18' also connected in identical fashion as the transistors 15, 16, 17 and 18.

As with the conventional mixer of FIG. 1 a second differential analog input signal is supplied to the bases of transistors 15 and 16 and to the bases of transistors 17 and 18 via input terminals VLO+ and VLO−. In addition, the second differential analog input signal is supplied to the bases of transistors 15' and 16' and to the bases of transistors 17' and 18' via input terminals VLO'− and VLO'+.

It is noted that the emitters of transistor pair 15, 16 of the one transistor quad are connected to the emitters of transistor pair 15', 16' of the other transistor quad and the emitters of transistor pair 17, 18 of the one transistor quad are connected to the emitters of transistor pair 17', 18' of the other transistor quad.

The collectors of transistors 15, 18 of the one transistor quad are connected to one side of a first current summing block 30 while the collectors of transistors 16, 17 of the one transistor quad are connected to one side of a second current summing block 31.

The collectors of transistors 15', 18' of the other transistor quad are connected to the other side of the first current summing block 30 while the collectors of transistors 16', 17' of the other transistor quad are connected to the other side of the current summing block 31.

In operation, the input differential pair 11, 12 serves to amplify the current produced by the input signal at terminals Vin+ and Vin− in much the same way as in the conventional circuit of FIG. 1. However, the DC bias is established in the complementary mixing quads and sets the class of mixer operation (A, B or AB) independent of the DC bias in the lower differential pair. More particularly, the DC bias is established to provide a DC offset between terminals VLO+ and VLO'+ and between VLO− and VLO'−. The result of independently setting the DC bias is that only signal energy is transferred to the mixing quads from the lower pair; for the class AB mode, for large signal input, only two of the four transimpedance pairs in the mixing quads will conduct at any one time, alternating with the other two transimpedance pairs over the positive and negative half cycles of the input signal. The outputs from the mixing quads are summed through the current summing blocks 30 and 31.

Figure 3:
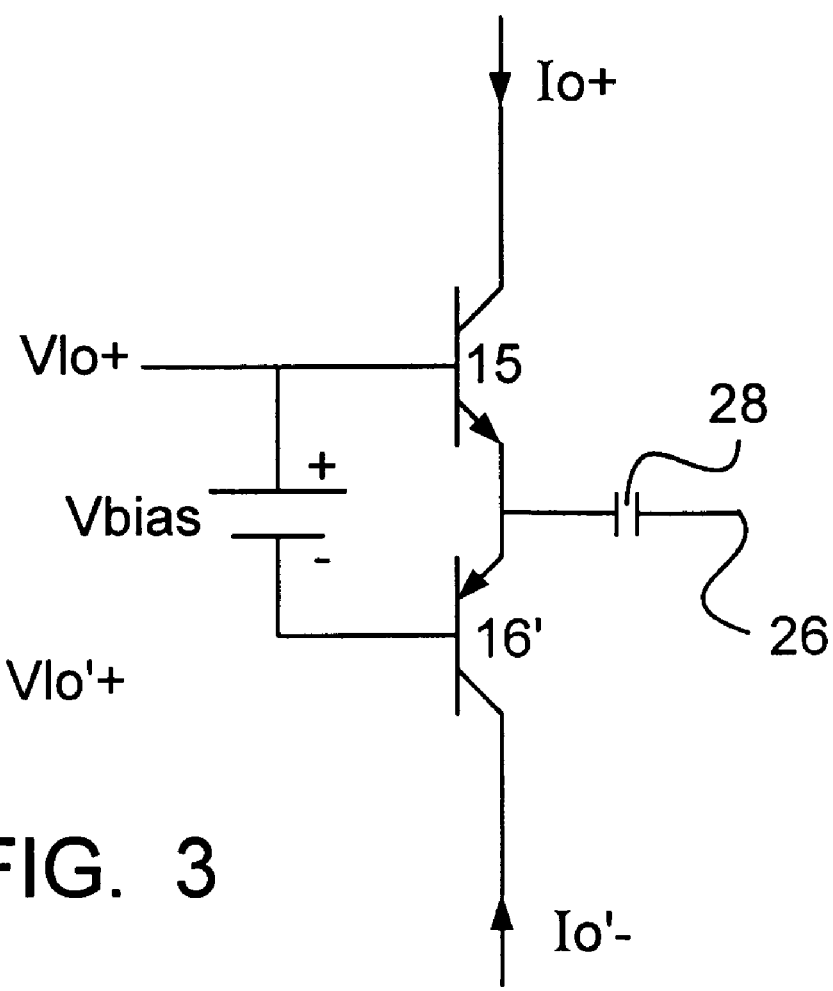
FIG. 3 illustrates the biasing of a portion of the mixer of FIG. 2.

The operation of a DC offset in the present invention is illustrated in FIG. 3 which shows the biasing of a portion of the complementary mixing quads. The DC offset between VLO+ and VLO'+ is achieved by a voltage Vbias applied between the bases of transistors 15 and 16'. This circuit is similar to the classical "push-pull" arrangement used in class A and class AB amplifier operation.

Figure 4:
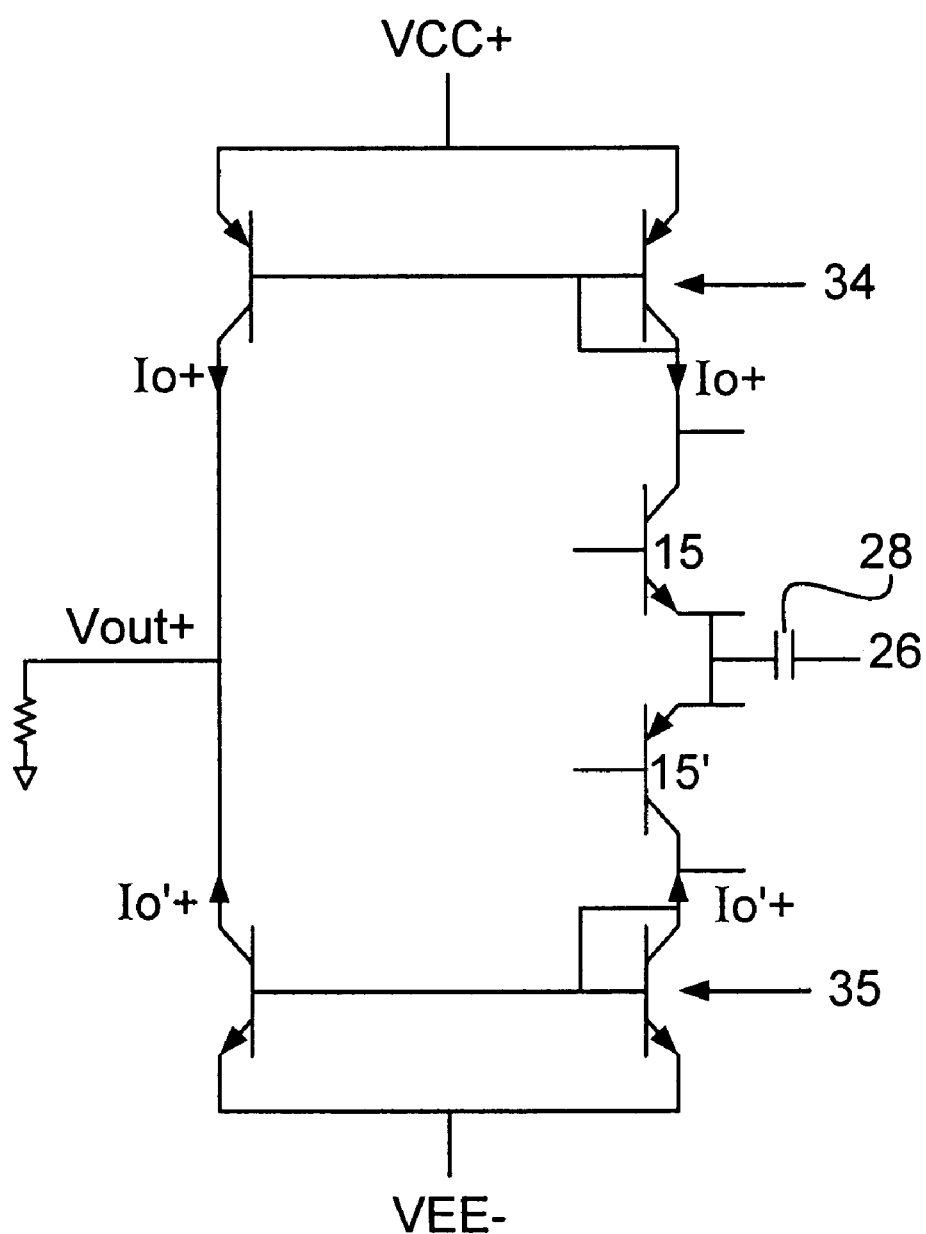
FIG. 4 illustrates the use of current mirrors to achieve current summing.

One practical way of achieving the current summing blocks 30, 31 is by using current mirrors as illustrated in FIG. 4. This Figure shows how current mirrors 34 and 35 are respectively connected between the collectors of transistors 15 and 15' and the output terminal Vout+ to provide current summing block 30. In this Figure, for clarity transistors 16, 17, 18 of the first transistor quad have been omitted and transistors 16', 17', 18' of the second transistor quad have been omitted for clarity. It should be understood that a similar current mirror circuit would be connected between the collectors of transistors 17 and 17', respectively and the output terminal Vout– to provide the current summing block 31. The construction and operation of current mirrors are well known in the art and will not, therefore, be described further here.

Figure 5:
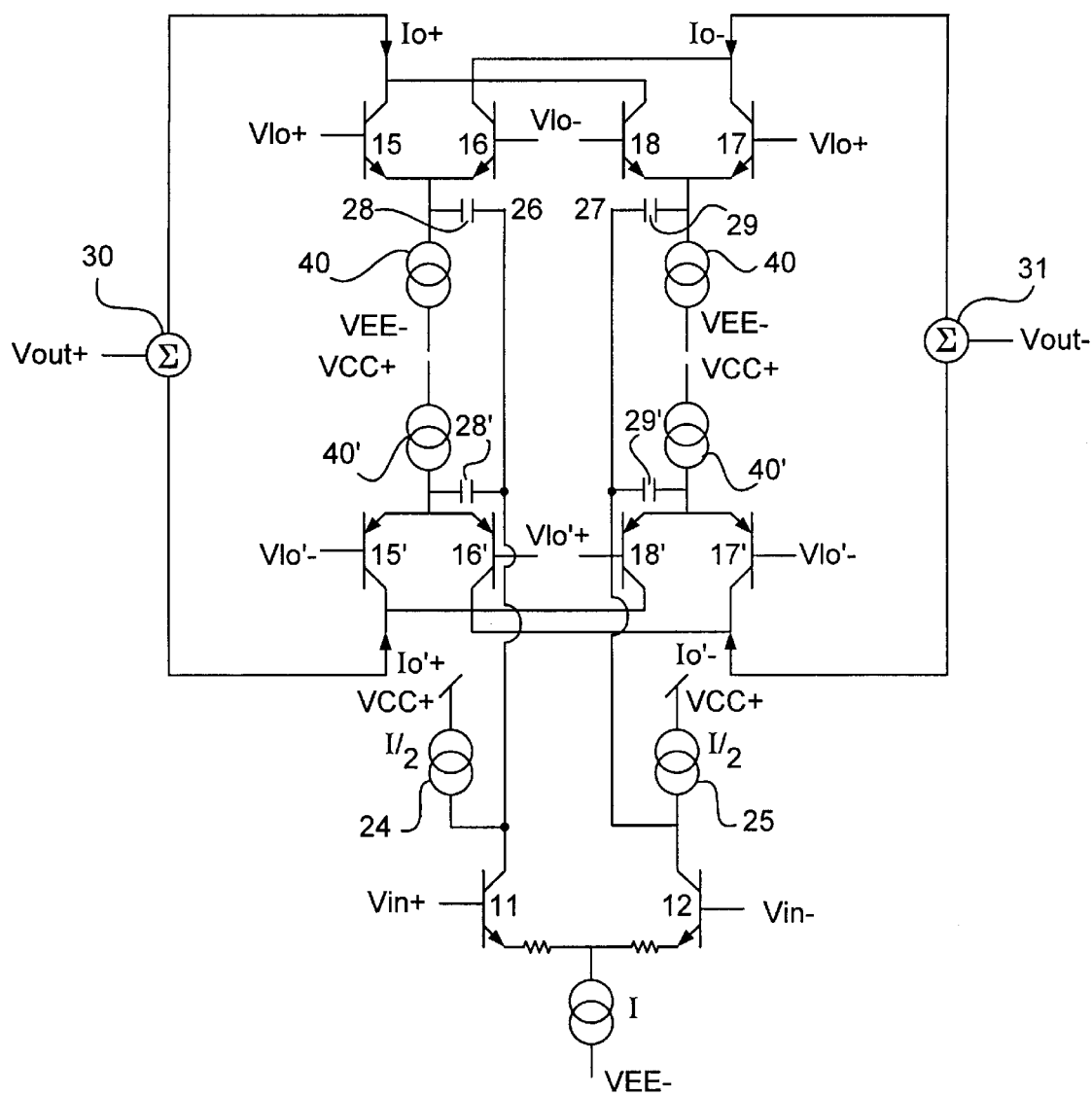
FIGS. 5 to 7 are schematic diagrams illustrating variants of the circuit illustrated in FIG. 2.

A low-voltage topology can be realized. This is illustrated in FIG. 5. This circuit is essentially identical to FIG. 2 except that the upper transistor quad 15, 16, 17, 18 and the lower transistor quad are not connected together in series between the supply rails VCC+ and VEE–. Instead, the lower end of the upper quad is connected through current sources 40 to the negative supply VEE– and the upper end of the lower quad is connected through current sources 40' to positive supply VCC+. Transistors 11 and 12 are connected through terminals 26 and 27 and capacitors 28 and 29 as before to the upper quad but they are also connected through capacitors 28' and 29' to the lower quad. The overall effect of this circuit is the same as FIG. 2 except that one Vbe drop between the supply rails VCC+ and VEE– may be removed which makes this circuit suitable for lower supply voltages.

Figure 6:
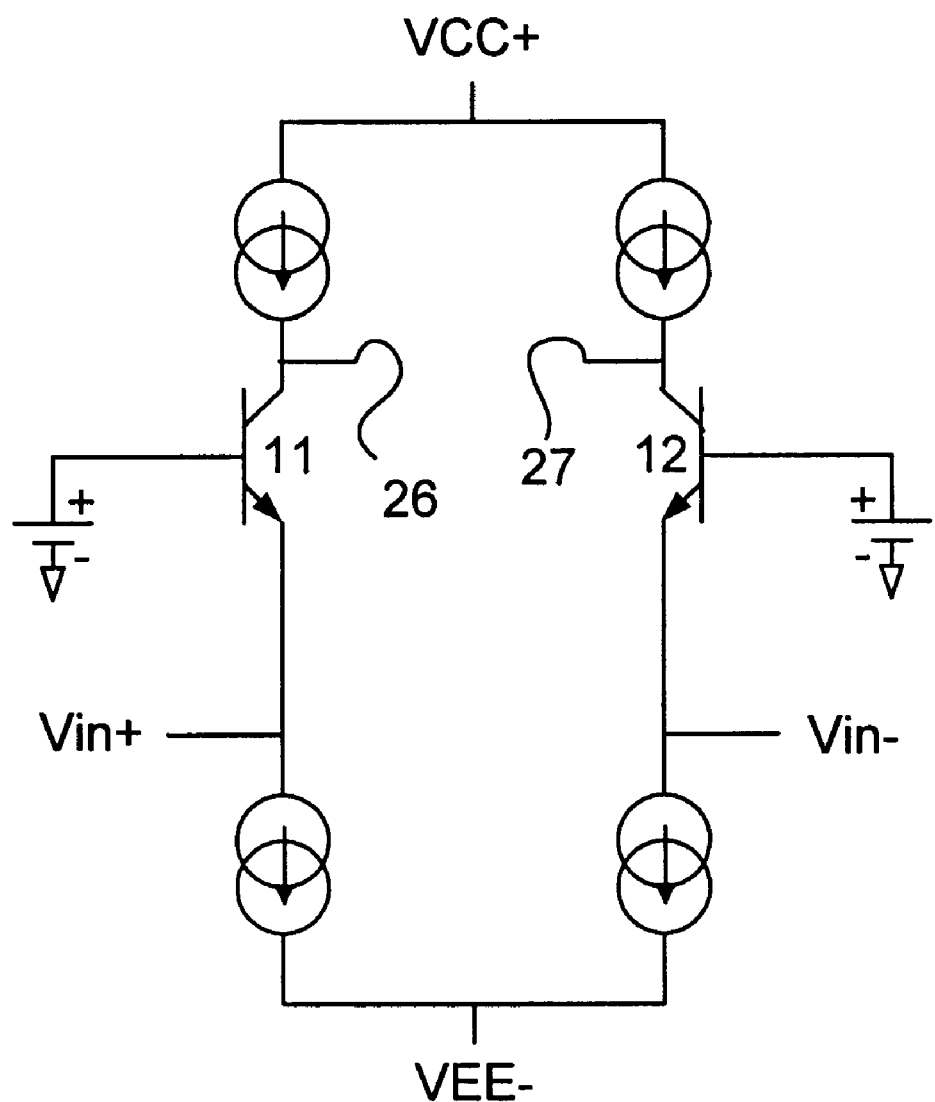

The lower transistor pair can be eliminated with the signal input applied directly to the mixing quad transistors at inputs 26 and 27. Alternatively, as illustrated in FIG. 6 the common emitter gain stage may be replaced with a common base gain stage. FIG. 6 illustrates only the input differential pair. The upper and lower quads are identical to those shown in FIG. 2 with the common base gain stage connected to terminals 26 and 27.

Figure 7:
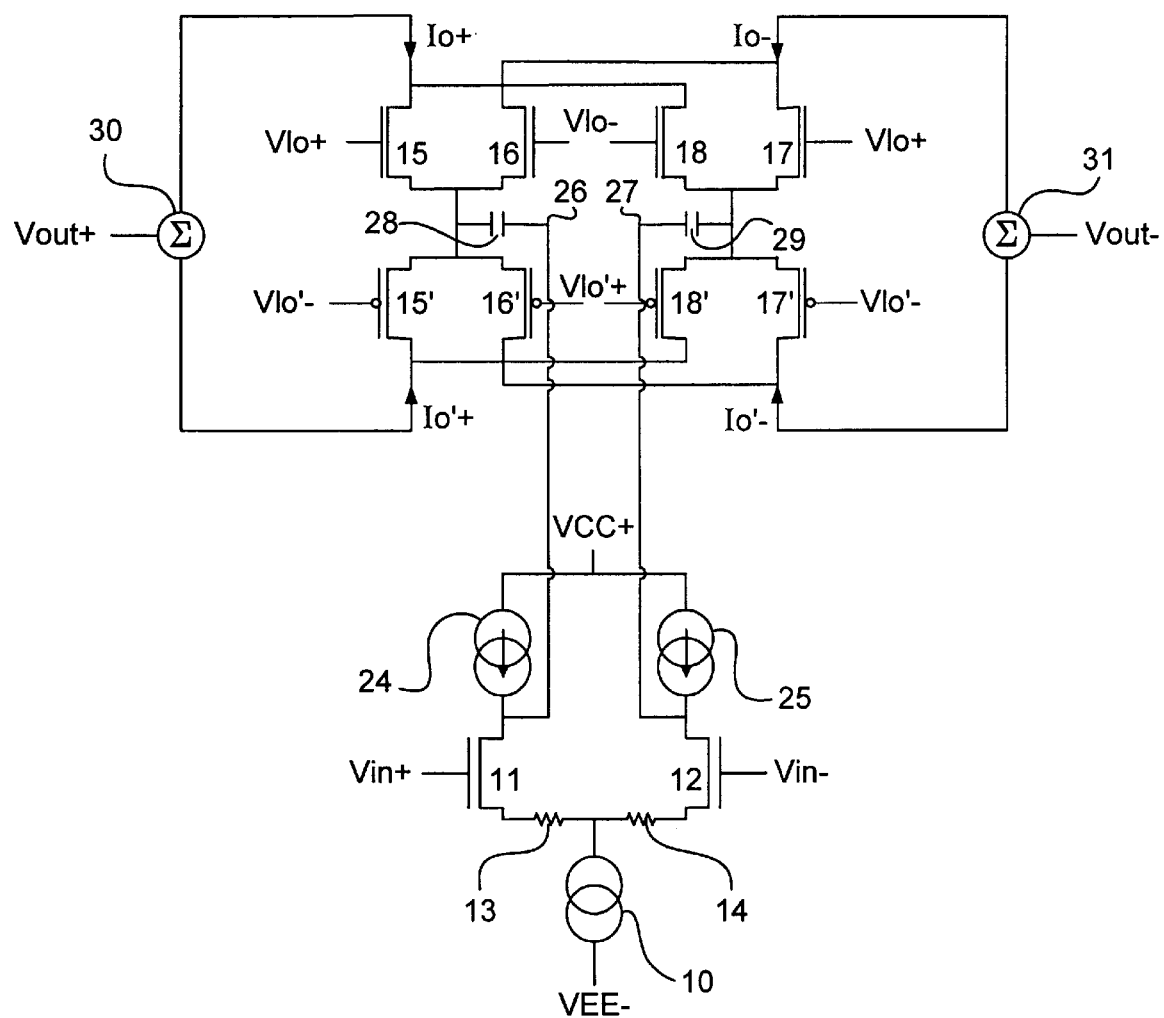

The disclosed invention may be applied to a variety of device and process technologies (e.g. NPN BJT, PNP BJT, N-FET, P-FET, CMOS, BiCMOS) as well. An example using complementary BiCMOS is illustrated in FIG. 7, with current summing circuits as illustrated in FIG. 4.

Figure 8:
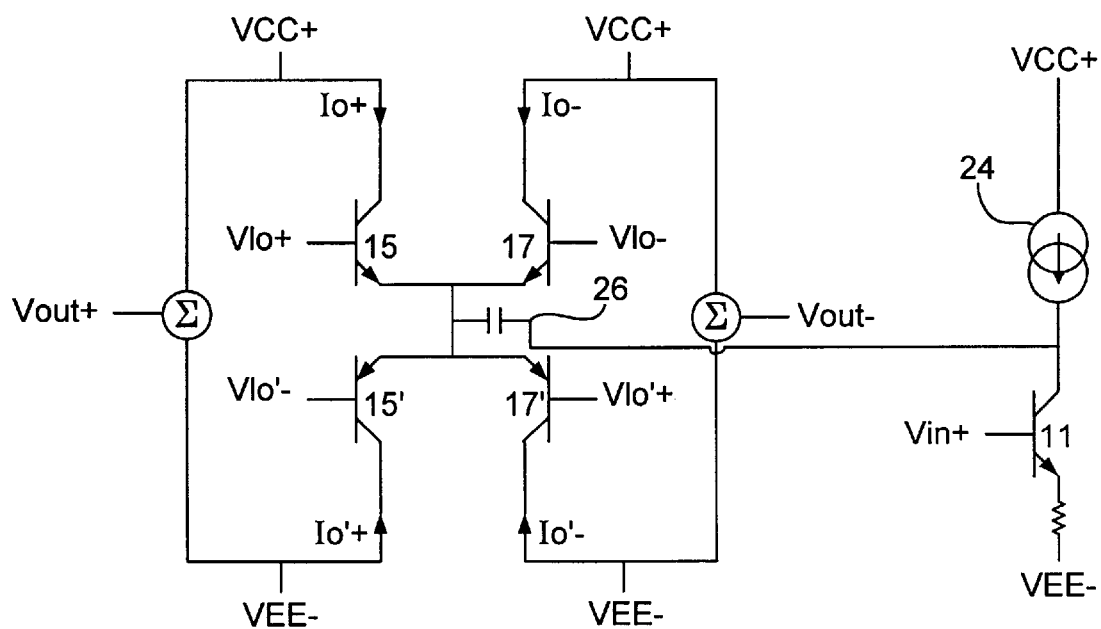
FIG. 8 is a schematic diagram illustrating a tree mixer constructed according to the invention for use with a single-ended input.

Finally, an embodiment of the invention in which, instead of a differential input signal, a single-ended input Vin is applied is shown in FIG. 8. The input stage is reduced to one transistor and the mixing stage is reduced to two complementary transistor pairs instead of quads. Otherwise the circuit structure and function is the same.

More particularly, the input Vin is converted to an amplified input signal by the input stage and this amplified input signal is supplied through a first input terminal 26 to the emitters of both differential pairs 15, 17 and 15', 17'. A second (differential) input signal is applied to the bases of transistors 15 and 17 serving as a second input of the first differential pair 15, 17. In addition, the second input signal is applied to the bases of transistors 15' and 17' serving as a third input for the second differential pair 15', 17'. The use of the notations VLO+, VLO– and VLO'+ and VLO'– indicates that, as with the embodiment of FIG. 2, the second input signal applied to the third input is provided with a DC offset with respect to the second input.

What I claim is:

1. A tree mixer mixing stage formed by a first transistor quad consisting of two differential pairs of transistors and a second transistor quad consisting of a further two differential pairs of transistors, the second transistor quad being complementary with respect to the first transistor quad; further comprising a first pair of input terminals for supplying a first differential input signal to both transistor quads, two second pairs of input terminals for supplying a second differential input signal to the first transistor quad and two third pairs of input terminals for supplying the second differential signal to the second transistor quad with a DC offset with respect to the second two pairs of input terminals, wherein the first transistor quad is connected to the second transistor quad through summing circuitry which includes an output for an output signals, the magnitude of the DC offset determining whether the mixing stage operates in Class A, class B or class AB.

2. A mixing stage according to claim 1, further comprising biasing circuitry connected between the first transistor quad and the second transistor quad to provide the DC offset.

3. A mixing stage according to claim 1, wherein the summing circuitry comprises current mirrors.

4. A mixing stage according to claim 1, wherein the transistors are bipolar transistors, the first transistor quad being npn and the second transistor quad being pnp.

5. A tree mixer comprising a mixing stage and a gain stage, the gain stage formed by a differential pair of bipolar transistors and having an input for receiving a first differential input signal and having a first output deriving an amplified differential input signal, the mixing stage formed by a first transistor quad consisting of two differential pairs of pnp transistors and a second transistor quad consisting of two differential pairs of npn transistors, the first output of the gain stage being connected to a first input of the first transistor quad and a first input of the second transistor quad, the mixing stage further comprising a second input for supplying a second differential input signal to the first transistor quad, a third input for supplying the second differential input signal to the second transistor quad, and biasing circuitry for applying a DC offset between the second and third inputs, the first and second transistor quads being interconnected through summing circuitry provided with a second output at which a differential output signal representing the product of the amplified differential input signal and the second differential input signal is obtained, whereby the magnitude of the DC offset determines whether the mixer operates in Class A, class B or Class AB.

6. A tree mixer comprising a gain stage and a mixing stage, the gain stage having an input terminal for receiving a first input signal and having an output terminal on which is output an amplified input signal, the mixing stage formed by a first differential pair of transistors and a second differential pair of transistors which are complementary with respect to the first differential pair, the mixing stage further comprising a first input terminal connected to the output terminal of the gain stage for supplying the amplified input signal to both differential pairs, a pair of second input terminals for supplying a second input signal to the first differential pair and a pair of third input terminals for supplying the second input signal to the second differential pair, and DC biasing circuitry connected between the first differential pair and the second differential pair to provide a DC offset on the pair of third input terminals with respect to the pair of second input terminals, wherein the first differential pair is connected to the second differential pair through summing circuitry which includes a pair of output terminals for an output signal, the magnitude of the DC offset determining whether the mixer operates in class A, class B or class AB.

7. A tree mixer according to claim 6, wherein the summing circuitry comprises current mirrors.

8. A tree mixer according to claim 7, in which there are two pairs of current mirrors, a first pair of current mirrors connected to the first differential pair and the third pair of current mirrors connected to the second differential pair.

9. A tree mixer comprising a gain stage and a mixing stage, the gain stage having a pair of input terminals for receiving a differential input signal and having a pair of output terminals on which is output an amplified differential input signal, the mixing stage formed by a first transistor quad consisting of two differential pairs of transistors and a second transistor quad consisting of a further two differential pairs of transistors, the second transistor quad being complementary with respect to the first transistor quad, the mixing stage further comprising a first pair of input terminals connected to the pair of output terminals of the gain stage for supplying the amplified differential input signal to both transistor quads, two second pairs of input terminals for supplying a second differential input signal to the first transistor quad and two third pairs of input terminals for supplying the second differential signal to the second transistor quad with a DC offset with respect to the second pairs of input terminals, wherein the first transistor quad is connected to the second transistor quad through summing circuitry which includes a pair of output terminals for an output signal, the magnitude of the DC offset determining whether the mixer operates in Class A, class B or class AB.

10. A tree mixer according to claim 9, further comprising biasing circuitry connected between the first transistor quad and the second transistor quad to provide the DC offset.

11. A tree mixer according to claim 9, wherein the summing circuitry comprises current mirrors.

12. A tree mixer according to claim 9, in which there are two pairs of current mirrors, a first pair of current mirrors connected to the first differential quad and a second pair of current mirrors connected to the second differential quad.

13. A tree mixer mixing stage comprising a first differential pair of transistors having a pair of electrodes coupled together and having a first pair and a second pair of uncoupled electrodes and a second differential pair of transistors having a pair of electrodes coupled together and having a first pair and a second pair of uncoupled electrodes, a first input terminal connected to both pairs of coupled electrodes for supplying a first input signal to both differential pairs, a pair of second input terminals connected to the first pair of uncoupled electrodes of the first differential pair for supplying a second, differential, input signal to the first differential pair, a pair of third input terminals connected to the first pair of uncoupled electrodes of the second differential pair for supplying the second, differential, input signal to the second differential pair, DC biasing circuitry connected to the first and second differential pairs to provide a DC offset between the two first pairs of uncoupled electrodes, and summing circuitry interconnecting the second pair of uncoupled electrodes of the first differential pair with the second pair of uncoupled electrodes of the second differential pair, the summing circuitry including a pair of output terminals, whereby the magnitude of the DC offset determines whether the mixing stage operates in class A, class B or class AB.

14. A mixing stage according to claim 13, wherein the summing circuitry comprises current mirrors.

15. A mixing stare according to claim 13, wherein the transistors are bipolar transistors, the first differential pair being npn and the second differential pair being pnp.

16. A tree mixer comprising a mixing stage according to claim 15, in combination with a gain stage formed by a bipolar transistor and having an input terminal for receiving an unamplified input signal and having an output terminal which is connected to the first input terminal of the mixing stage.

* * * * *